(12) United States Patent
Yang (10) Patent No.: US 11,348,893 B2
(45) Date of Patent: May 31, 2022

(54) SEMICONDUCTOR PACKAGE

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 191 days.

(21) Appl. No.: 15/930,437

(22) Filed: May 13, 2020

(65) Prior Publication Data

US 2021/0358878 A1 Nov. 18, 2021

(51) Int. Cl.
*H01L 23/00* (2006.01)
*H01L 23/528* (2006.01)
*H01L 23/31* (2006.01)

(52) U.S. Cl.
CPC .......... *H01L 24/45* (2013.01); *H01L 23/3121* (2013.01); *H01L 23/5286* (2013.01); *H01L 24/05* (2013.01); *H01L 24/13* (2013.01); *H01L 24/29* (2013.01)

(58) Field of Classification Search
CPC ..... H01L 24/45; H01L 23/5286; H01L 24/05; H01L 24/13; H01L 24/29; H01L 23/3121–3128; H01L 25/043; H01L 25/0657; H01L 25/074; H01L 25/0756; H01L 25/117; H01L 2225/06503; H01L 2225/06506; H01L 2225/0651; H01L 2225/06572; H01L 2225/06586
See application file for complete search history.

(56) References Cited

U.S. PATENT DOCUMENTS

| 2002/0027295 | A1  | 3/2002  | Kikuma et al. |
| 2005/0001305 | A1* | 1/2005  | Kyung ............... H01L 25/0657 257/686 |
| 2006/0197206 | A1* | 9/2006  | Kim ..................... H01L 25/0657 257/686 |
| 2008/0116557 | A1* | 5/2008  | Paek ................... H01L 25/0657 257/686 |
| 2015/0318265 | A1* | 11/2015 | Isa ..................... H01L 23/49838 257/777 |

FOREIGN PATENT DOCUMENTS

| CN | 110854084 A  | 2/2020  |
| TW | 200638526 A  | 11/2006 |
| TW | 201442200 A  | 11/2014 |
| TW | 201901871 A  | 1/2019  |

* cited by examiner

*Primary Examiner* — Shahed Ahmed
*Assistant Examiner* — Sun Mi Kim King
(74) *Attorney, Agent, or Firm* — CKC & Partners Co., LLC (57) ABSTRACT

A semiconductor package includes a first semiconductor die, a first substrate, a second semiconductor die, and a second substrate. The first substrate is disposed on the first semiconductor die and includes a plurality of first metal line layers vertically spaced apart from each other, and each of the first metal line layers is electrically connected to one of the followings: a ground source and a plurality of power sources of different types. The second semiconductor die is disposed on the first substrate. The second substrate is disposed on the second semiconductor die and includes a plurality of second metal line layers vertically spaced apart from each other, and each of the second metal line layers is electrically connected to one of the followings: the ground source and the power sources of different types.

18 Claims, 6 Drawing Sheets

SEMICONDUCTOR PACKAGE

BACKGROUND

Field of Invention

The present disclosure relates to a semiconductor package.

Description of Related Art

Dual-die packaging (DPP) technology is widely used to pack two integrated circuit chips in one single package module, such that one single package module is capable of offering a double level of functionality or data storage capacity. Memory chips, such as dynamic random access memory (DRAM) chips, are typically packaged in this way so as to allow one single memory module to offer a double level of data storage capacity. Recently, various kinds of dual-die packaging technologies have been developed and utilized in the semiconductor industry.

Generally, a ground source and multiple power sources are required for operating a DRAM chip, and golden wires and redistribution layers are often used to transmit current between the power/ground sources and the DRAM chip. However, when a large transient current is required for the operation of the DRAM chip (e.g., high frequency operation), the golden wires and the redistribution layers operated at a high frequency would form a large resistance and hence restricts the transmission of the large transient current. As a result, a transient voltage drop occurs in the DRAM chip and eventually causes chip mis-operation. Accordingly, it is desirable to develop a semiconductor device with an improved functionality to overcome the problem mentioned above.

SUMMARY

The present disclosure relates in general to a semiconductor package.

According to an embodiment of the present disclosure, the semiconductor package includes a first semiconductor die, a first substrate, a second semiconductor die, and a second substrate. The first substrate is disposed on the first semiconductor die and includes a plurality of first metal line layers vertically spaced apart from each other, and each of the first metal line layers is electrically connected to one of the followings: a ground source and a plurality of power sources of different types. The second semiconductor die is disposed on the first substrate. The second substrate is disposed on the second semiconductor die and includes a plurality of second metal line layers vertically spaced apart from each other, and each of the second metal line layers is electrically connected to one of the followings: the ground source and the power sources of different types.

In some embodiments of the present disclosure, the semiconductor package further includes a plurality of conductive wires connecting the first semiconductor die to the first metal line layers.

In some embodiments of the present disclosure, the semiconductor package further includes a plurality of conductive wires connecting the second semiconductor die to the second metal line layers.

In some embodiments of the present disclosure, the semiconductor package further includes a plurality of conductive wires, and each of the conductive wires connects the first metal line layers to one of the followings: the ground source and the power sources of different types.

In some embodiments of the present disclosure, the semiconductor package further includes a plurality of conductive wires, and each of the conductive wires connects the second metal line layers to one of the followings: the ground source and the power sources of different types.

In some embodiments of the present disclosure, the semiconductor package further includes a plurality of first redistribution layers vertically between the first semiconductor die and the first substrate.

In some embodiments of the present disclosure, the semiconductor package further includes at least one conductive wire connecting at least one of the first redistribution layers to a signal source.

In some embodiments of the present disclosure, the semiconductor package further includes a plurality of conductive pads horizontally adjacent the first redistribution layers, wherein at least one of the conductive pads is in contact with at least one of the first redistribution layers.

In some embodiments of the present disclosure, the semiconductor package further includes a plurality of second redistribution layers vertically between the second semiconductor die and the second substrate.

In some embodiments of the present disclosure, the semiconductor package further includes at least one conductive wire connecting at least one of the second redistribution layers to a signal source.

In some embodiments of the present disclosure, the semiconductor package further includes a plurality of conductive pads horizontally adjacent the second redistribution layers, wherein at least one of the conductive pads is in contact with at least one of the second redistribution layers.

In some embodiments of the present disclosure, the semiconductor package further includes a plurality of vias embedded in the first substrate and vertically connecting two of the first metal line layers.

In some embodiments of the present disclosure, the semiconductor package further includes a plurality of vias embedded in the second substrate and vertically connecting two of the second metal line layers.

In some embodiments of the present disclosure, the semiconductor package further includes a first adhesive layer vertically between the first semiconductor die and the first substrate.

In some embodiments of the present disclosure, the semiconductor package further includes a second adhesive layer vertically between the second semiconductor die and the second substrate.

In some embodiments of the present disclosure, the semiconductor package further includes a third adhesive layer vertically between the second semiconductor die and the first substrate.

In some embodiments of the present disclosure, the semiconductor package further includes a third substrate on a surface of the first semiconductor die facing away from the first substrate.

In some embodiments of the present disclosure, the semiconductor package further includes a plurality of solder balls mounted on a surface of the third substrate facing away from first semiconductor die.

In some embodiments of the present disclosure, the semiconductor package further includes a molding compound encapsulating the first semiconductor die, the first substrate, the second semiconductor die, and the second substrate.

In some embodiments of the present disclosure, the molding compound penetrates through the first substrate and the second substrate.

In the aforementioned embodiments of the present disclosure, since the first substrate including the first metal line layers are disposed on the first semiconductor die, the first semiconductor die can be electrically connected to the ground source and the multiple power sources through the first substrate. Similarly, since the second substrate including the second metal line layers are disposed on the second semiconductor die, the second semiconductor die can be electrically connected to the ground source and the multiple power sources through the second substrate. Accordingly, the large resistance which causes the transient voltage drop in the semiconductor package can be prevented, and thus the power supply from external electronic devices can be stably provided to the semiconductor package even when a large transient current is needed. Accordingly, the semiconductor package can still perform well even when there is a demand for large transient current.

BRIEF DESCRIPTION OF THE DRAWINGS

The disclosure can be more fully understood by reading the following detailed description of the embodiments, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

Figure 1:
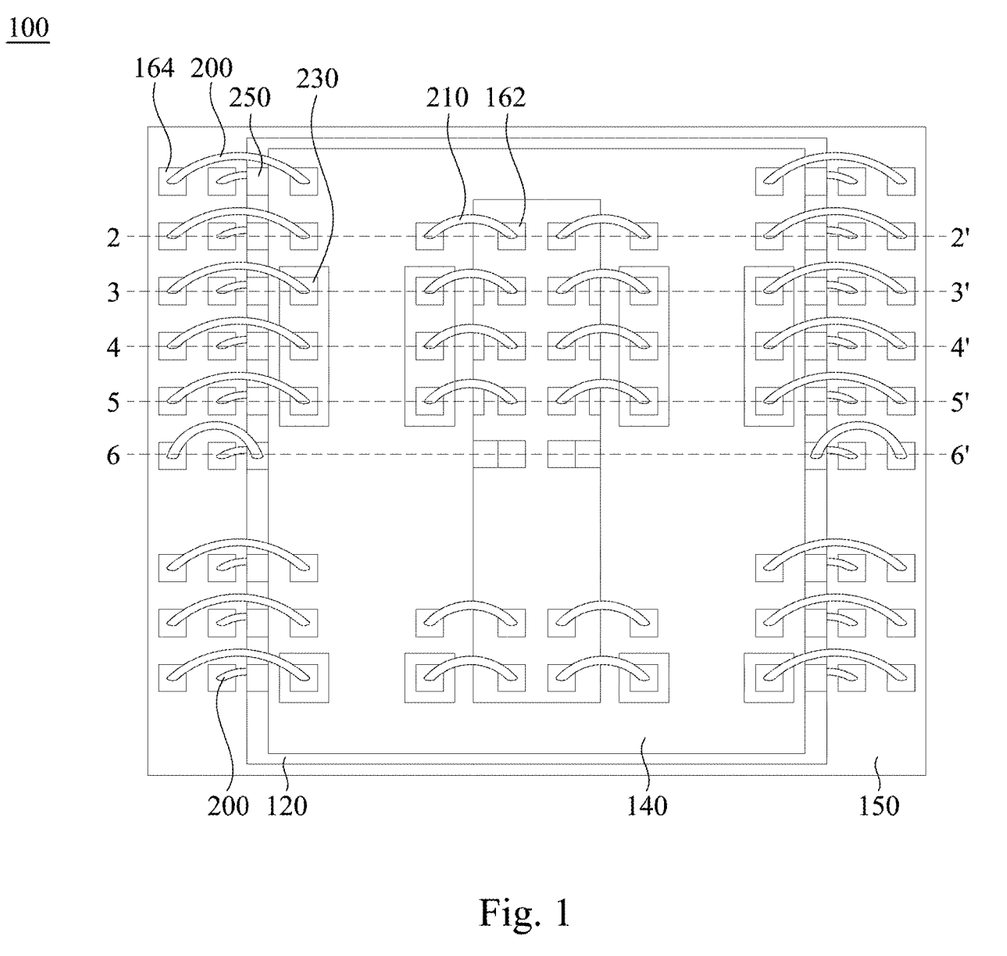
FIG. 1 is a schematic top view illustrating a semiconductor package according to an embodiment of the present disclosure.
Figure 2:
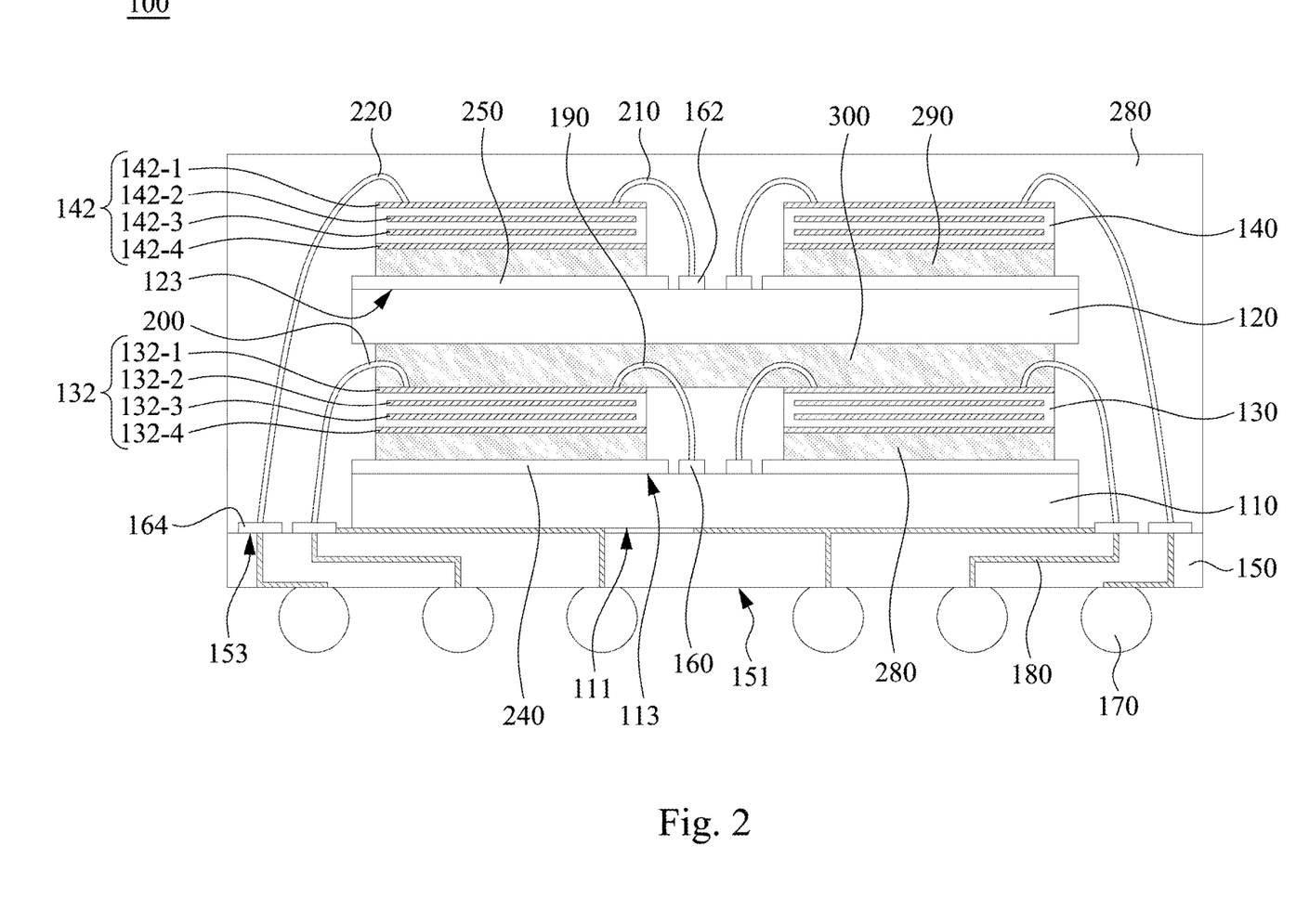
FIG. 2 is a schematic cross-sectional view of the semiconductor package illustrated in FIG. 1 along line 2-2'.

FIG. 1 is a schematic top view illustrating a semiconductor package 100 according to an embodiment of the present disclosure. FIG. 2 is a schematic cross-sectional view of the semiconductor package 100 illustrated in FIG. 1 along line 2-2'. Reference is made to FIG. 1 and FIG. 2. The semiconductor package includes a first semiconductor die 110, a second semiconductor die 120, a first substrate 130, and a second substrate 140. The first substrate 130 is disposed on the first semiconductor die 110, the second semiconductor die 120 is disposed on the first substrate 130, and the second substrate 140 is disposed on the second semiconductor die 120. Stated differently, the first substrate 130, the second semiconductor die 120, and the second substrate 140 are sequentially stacked on the first semiconductor die 110.

The first substrate 130 includes a plurality of first metal line layers 132 (e.g., layers having laterally extending metal lines) vertically stacked and spaced apart from each other by (e.g., dielectric materials in the first semiconductor substrate), and each of the first metal line layers 132 is electrically connected to one of the followings: a ground source and a plurality of power sources of different types, by using one or more vertically extending vias in the first substrate 130 (as illustrated in FIGS. 3-6). For example, the first substrate 130 includes the first metal line layers 132-1, 132-2, 132-3, and 132-4, the first metal line layers 132-1 is electrically connected to the ground source, the first metal line layers 132-2 is electrically connected to a VDD power source, the first metal line layers 132-3 is electrically connected to a VDD2 power source, and the first metal line layers 132-4 is electrically connected to a VDDQ power source. However, the connection relationships between the first metal line layers 132-1, 132-2, 132-3, and 132-4 and the ground/power sources (i.e., the ground source and the VDD, VDD2, and VDDQ power sources) are not limited thereto, and other connection relationships may be designed as deemed necessary by designers.

The second substrate includes a plurality of second metal line layers 142 vertically stacked and spaced apart from each other, and each of the second metal line layers 142 is electrically connected to one of the followings: the ground source and the power sources of different types, by using one or more vertically extending vias in the second substrate 140 (as illustrated in FIGS. 3-6). For example, the second substrate 140 includes the second metal line layers 142-1, 142-2, 142-3, and 142-4, the second metal line layers 142-1 is electrically connected to the ground source, the second metal line layers 142-2 is electrically connected to the VDD power source, the second metal line layers 142-3 is electrically connected to the VDD2 power source, and the second metal line layers 142-4 is electrically connected to the VDDQ power source. However, the connection relationships between the second metal line layers 142-1, 142-2, 142-3, and 142-4 and the ground/power sources (i.e., the ground source and the VDD, VDD2, and VDDQ power sources) are not limited thereto, and other connection relationships may be designed as deemed necessary by designers.

It is noted that for simplicity and clarity, in the following descriptions, the first metal line layers 132-1 and the second metal line layers 142-1 are regarded as being electrically connected to the ground source, the first metal line layers 132-2 and the second metal line layers 142-2 are regarded as being electrically connected to the VDD power source, the first metal line layers 132-3 and the second metal line layers 142-3 are regarded as being electrically connected to the VDD2 power source, and the first metal line layers 132-4 and the second metal line layers 142-4 are regarded as being electrically connected to the VDDQ power source.

In some embodiments, the semiconductor package 100 further includes a third substrate 150 disposed on a surface 111 of the first semiconductor die 110 facing away from the first substrate 130. In some embodiments, vertical projection areas of the first substrate 130 and the second substrate 140 on the third substrate 150 are smaller than vertical projection areas of the first semiconductor die 110 and the second semiconductor die 120 on the third substrate 150. In some embodiments, the vertical projection area of the first substrate 130 on the third substrate 150 is identical to the vertical projection area of the second substrate 140 on the third substrate 150, and the vertical projection area of the first semiconductor die 110 on the third substrate 150 is identical to the vertical projection area of the second semiconductor die 120 on the third substrate 150.

In some embodiments, the semiconductor package 100 further includes a plurality of first conductive pads 160, a plurality of second conductive pads 162, and a plurality of third conductive pads 164. The first conductive pads 160 are disposed on a surface 113 of the first semiconductor die 110 facing toward the first substrate 130, the second conductive pads 162 are disposed on a surface 123 of the second semiconductor die 120 facing toward the second substrate 140, and the third conductive pads 164 are disposed on a surface 153 of the third substrate 150 facing toward the first semiconductor die 110. The first conductive pads 160, the second conductive pads 162, and the third conductive pads 164 are configured for the bonding of conductive wires.

In some embodiments, the semiconductor package 100 further includes a plurality of solder balls 170 mounted on a surface 151 of the third substrate 150 facing away from the first semiconductor die 110. Stated differently, the third conductive pads 164 and the solder balls 170 are on opposite surfaces of the third substrate 150. In some embodiments, the semiconductor package 100 further includes a plurality of interconnect structures 180 (e.g., metal lines and metal vias) in the third substrate 150, such that the first semiconductor die 110 and the second semiconductor die 120 can further be electrically connected to the external ground source and power sources, as will be discussed later in the following descriptions.

In some embodiments, the semiconductor package 100 further includes a plurality of first conductive wires 190 and a plurality of second conductive wires 200. The first conductive wires 190 connect the first semiconductor die 110 to the first substrate 130, and the second conductive wires 200 connect the first substrate 130 to the third substrate 150, such that the first semiconductor die 110 can further be electrically connected to the ground source and the power sources through the interconnect structures 180 and the solder balls 170. In some embodiments, the semiconductor package 100 further includes a plurality of third conductive wires 210 and a plurality of fourth conductive wires 220. The third conductive wires 210 connect the second semiconductor die 120 to the second substrate 140, and the fourth conductive wires 220 connect the second substrate 140 to the third substrate 150, such that the second semiconductor die 120 can further be electrically connected to the ground source and the power sources through the interconnect structures 180 and the solder balls 170. The electrical connections mentioned above will further be discussed in detail through FIG. 2 to FIG. 5 in the following descriptions.

As shown in FIG. 1 and FIG. 2, at least one of the first conductive wires 190 connects the first semiconductor die 110 to the first metal line layer 132-1 of the first substrate 130, and at least one of the second conductive wires 200 connects the first metal line layer 132-1 of the first substrate 130 to the third substrate 150, such that the first semiconductor die 110 can further be electrically connected to the ground source. Similarly, at least one of the third conductive wires 210 connects the second semiconductor die 120 to the second metal line layer 142-1 of the second substrate 140, and at least one of the fourth conductive wires 220 connects the second metal line layer 142-1 of the second substrate 140 to the third substrate 150, such that the second semiconductor die 120 can further be electrically connected to the ground source. Accordingly, through the configuration of the first metal line layer 132-1 and the second metal line layer 142-1, the first semiconductor die 110 and the second semiconductor die 120 can be electrically connected to the ground source.

In some embodiments, the semiconductor package 100 further includes a first adhesive layer 280, a second adhesive layer 290, and a third adhesive layer 300. The first adhesive layer 280 is vertically between the first semiconductor die 110 and the first substrate 130, the second adhesive layer 290 is vertically between the second semiconductor die 120 and the second substrate 140, and the third adhesive layer 300 is vertically between the first substrate 130 and the second semiconductor die 120. In some embodiments, a vertical projection area of the first adhesive layer 280 on the third substrate 150 entirely overlaps a vertical projection area of the second adhesive layer 290 on the third substrate 150. In some embodiments, a vertical projection area of the third adhesive layer 300 is larger than a vertical projection area of the first adhesive layer 280 on the third substrate 150.

Figure 3:
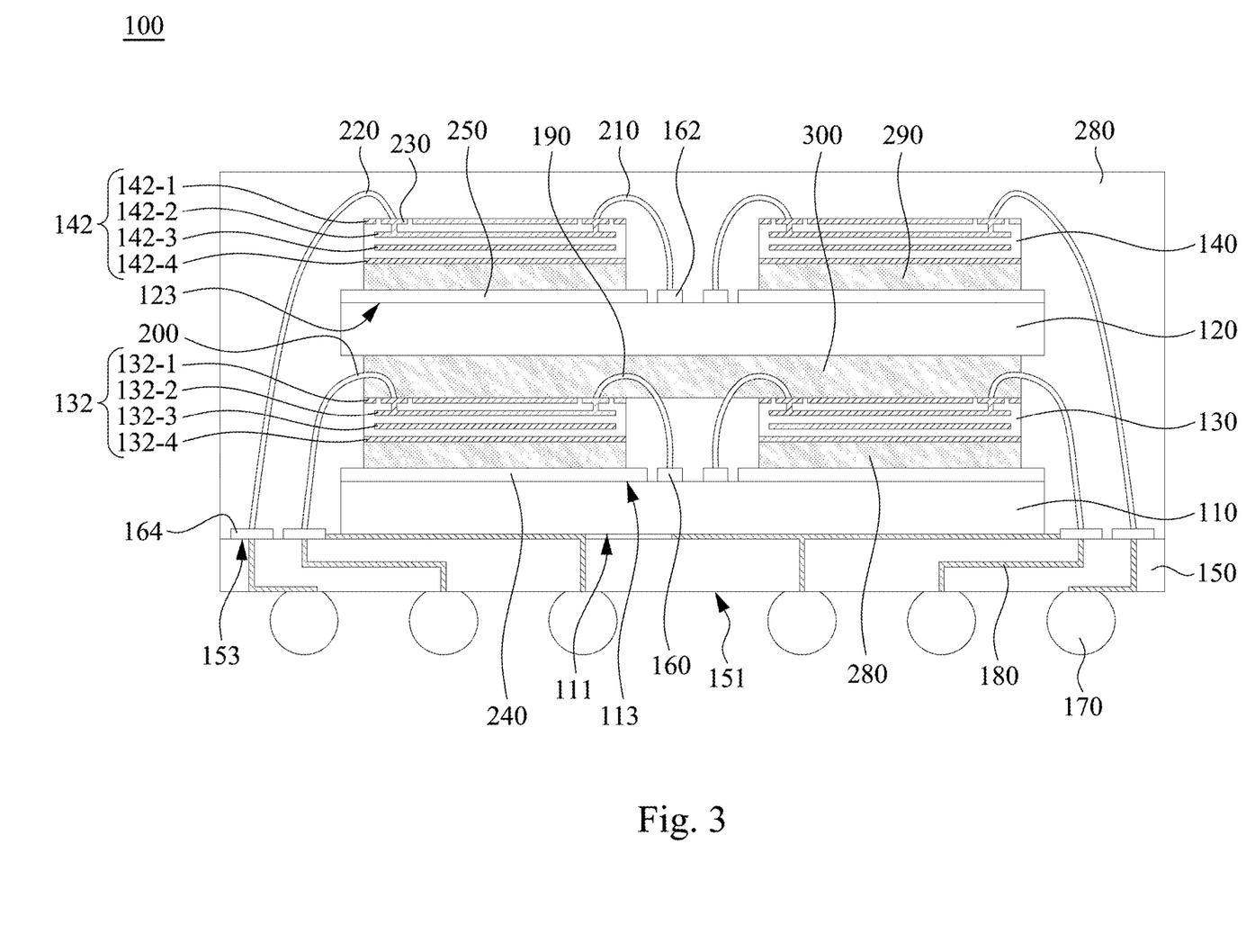
FIG. 3 is a schematic cross-sectional view of the semiconductor package illustrated in FIG. 1 along line 3-3'.

FIG. 3 is a schematic cross-sectional view of the semiconductor package 100 illustrated in FIG. 1 along line 3-3'. As shown in FIG. 1 and FIG. 3, the semiconductor package 100 further includes a plurality of vias 230 embedded in the first substrate 130 and the second substrate 140. At least one of the first conductive wires 190 connects the first semiconductor die 110 to the first metal line layer 132-2 of the first substrate 130 through at least one of the vias 230, and at least one of the second conductive wires 200 connects the first metal line layer 132-2 of the first substrate 130 through at least one of the vias 230 to the third substrate 150, such that the first semiconductor die 110 can further be electrically connected to the VDD power source. Similarly, at least one of the third conductive wires 210 connects the second semiconductor die 120 to the second metal line layer 142-2 of the second substrate 140 through at least one of the vias 230, and at least one of the fourth conductive wires 220 connects the second metal line layer 142-2 of the second substrate 140 through at least one of the vias 230 to the third substrate 150, such that the second semiconductor die 120 can further be electrically connected to the VDD power source. Accordingly, through the configuration of the first metal line layer 132-2 and the second metal line layer 142-2, the first semiconductor die 110 and the second semiconductor die 120 can be electrically connected to the VDD power source.

Figure 4:
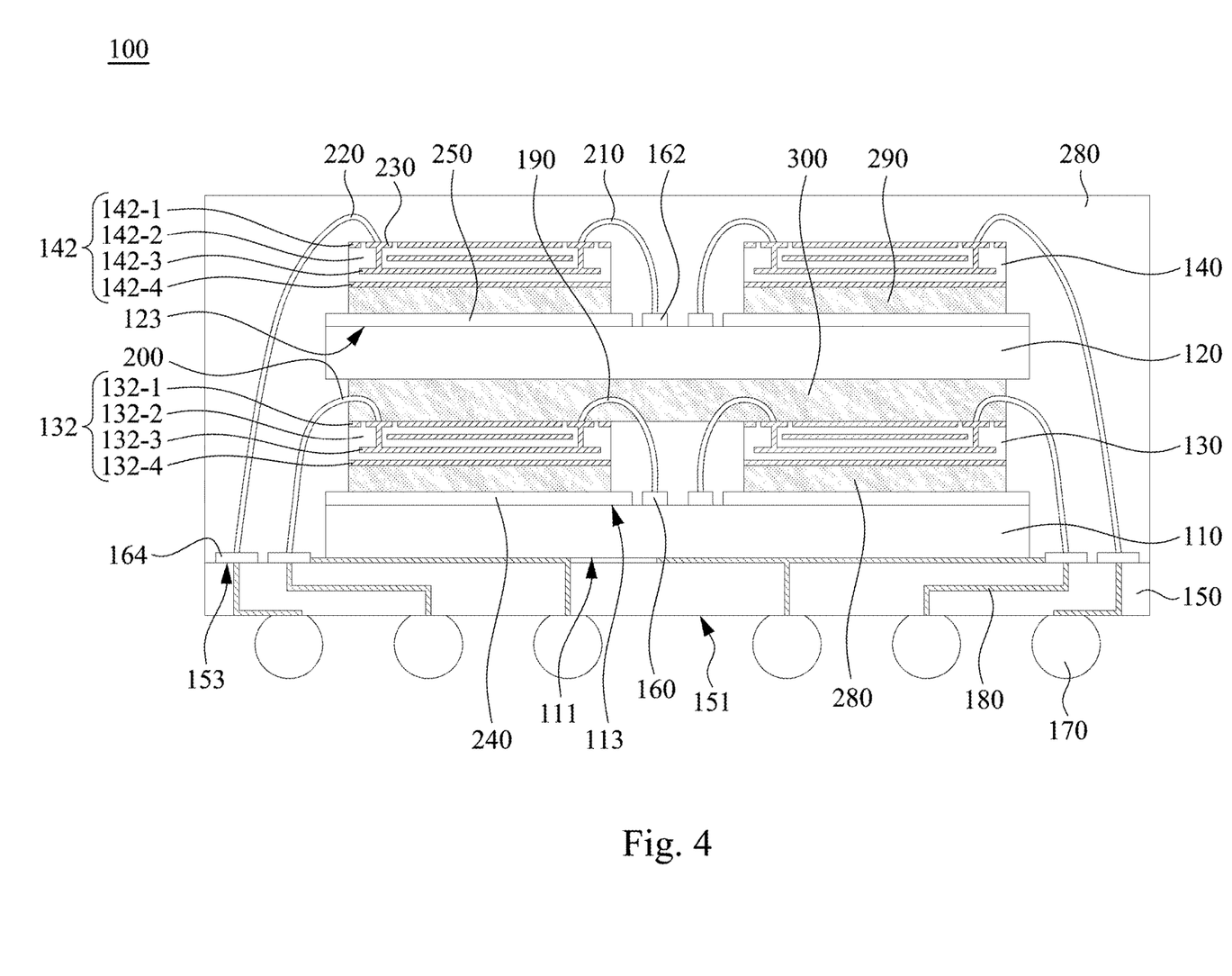
FIG. 4 is a schematic cross-sectional view of the semiconductor package illustrated in FIG. 1 along line 4-4'.

FIG. 4 is a schematic cross-sectional view of the semiconductor package 100 illustrated in FIG. 1 along line 4-4'. As shown in FIG. 1 and FIG. 4, at least one of the first conductive wires 190 connects the first semiconductor die 110 to the first metal line layer 132-3 of the first substrate 130 through at least one of the vias 230, and at least one of the second conductive wires 200 connects the first metal line layer 132-3 of the first substrate 130 through at least one of the vias 230 to the third substrate 150, such that the first semiconductor die 110 can further be electrically connected to the VDD2 power source. Similarly, at least one of the third conductive wires 210 connects the second semiconductor die 120 to the second metal line layer 142-3 of the second substrate 140 through at least one of the vias 230, and at least one of the fourth conductive wires 220 connects the second metal line layer 142-3 of the second substrate 140 through at least one of the vias 230 to the third substrate 150, such that the second semiconductor die 120 can further be electrically connected to the VDD2 power source. Accordingly, through the configuration of the first metal line layer 132-3 and the second metal line layer 142-3, the first semiconductor die 110 and the second semiconductor die 120 can be electrically connected to the VDD2 power source.

Figure 5:
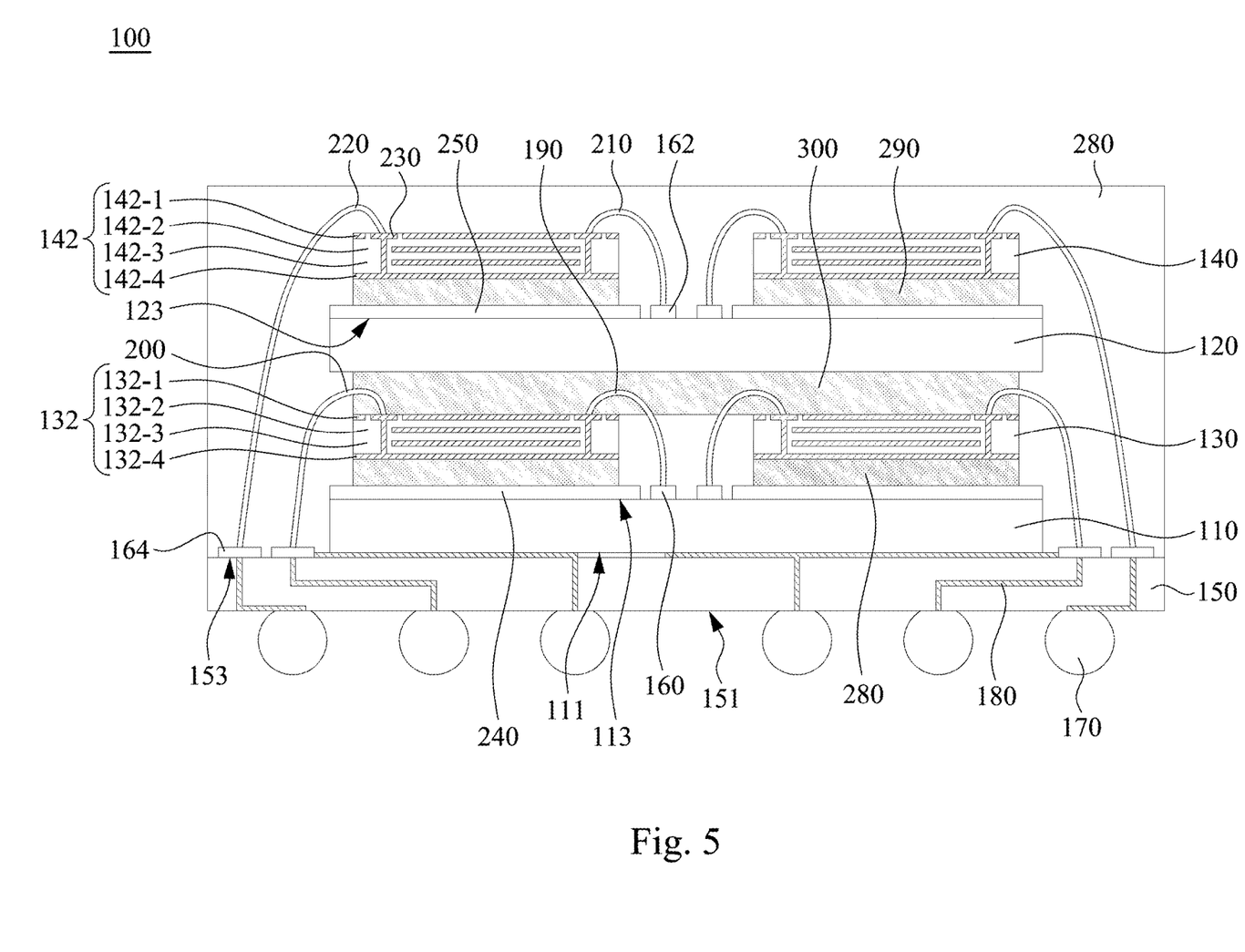
FIG. 5 is a schematic cross-sectional view of the semiconductor package illustrated in FIG. 1 along line 5-5'.

FIG. 5 is a schematic cross-sectional view of the semiconductor package 100 illustrated in FIG. 1 along line 5-5'. As shown in FIG. 1 and FIG. 5, at least one of the first conductive wires 190 connects the first semiconductor die 110 to the first metal line layer 132-4 of the first substrate 130 through at least one of the vias 230, and at least one of the second conductive wires 200 connects the first metal line layer 132-4 of the first substrate 130 through at least one of the vias 230 to the third substrate 150, such that the first semiconductor die 110 can further be electrically connected to the VDDQ power source. Similarly, at least one of the third conductive wires 210 connects the second semiconductor die 120 to the second metal line layer 142-4 of the second substrate 140 through at least one of the vias 230, and at least one of the fourth conductive wires 220 connects the second metal line layer 142-4 of the second substrate 140 through at least one of the vias 230 to the third substrate 150, such that the second semiconductor die 120 can further be electrically connected to the VDDQ power source. Accordingly, through the configuration of the first metal line layer 132-4 and the second metal line layer 142-4, the first semiconductor die 110 and the second semiconductor die 120 can be electrically connected to the VDDQ power source.

It is noted that although not illustrated herein, the first semiconductor die 110 and the second semiconductor die 120 may be electrically connected to different types of the ground/power source in a single cross-sectional view. For example, the first semiconductor die 110 may be electrically connected to the ground source while the second semiconductor die 120 is electrically connected to the VDD power source in a single cross-sectional view. For another example, the first semiconductor die 110 may be electrically connected to the VDD power source while the second semiconductor die 120 is electrically connected to the VDDQ power source in a single cross-sectional view.

Since the first semiconductor die 110 is electrically connected to the ground source and the power sources through the first metal line layers 132-1, 132-2, 132-3, and 132-4 of the first substrate 130, and the second semiconductor die 120 is electrically connected to the ground source and the power sources through the second metal line layers 142-1, 142-2, 142-3, and 142-4 of the second substrate 140, the large resistance which causes the transient voltage drop in the semiconductor package 100 can be prevented, and thus the power supply from external electronic devices can be stably provided to the semiconductor package 100.

Figure 6:
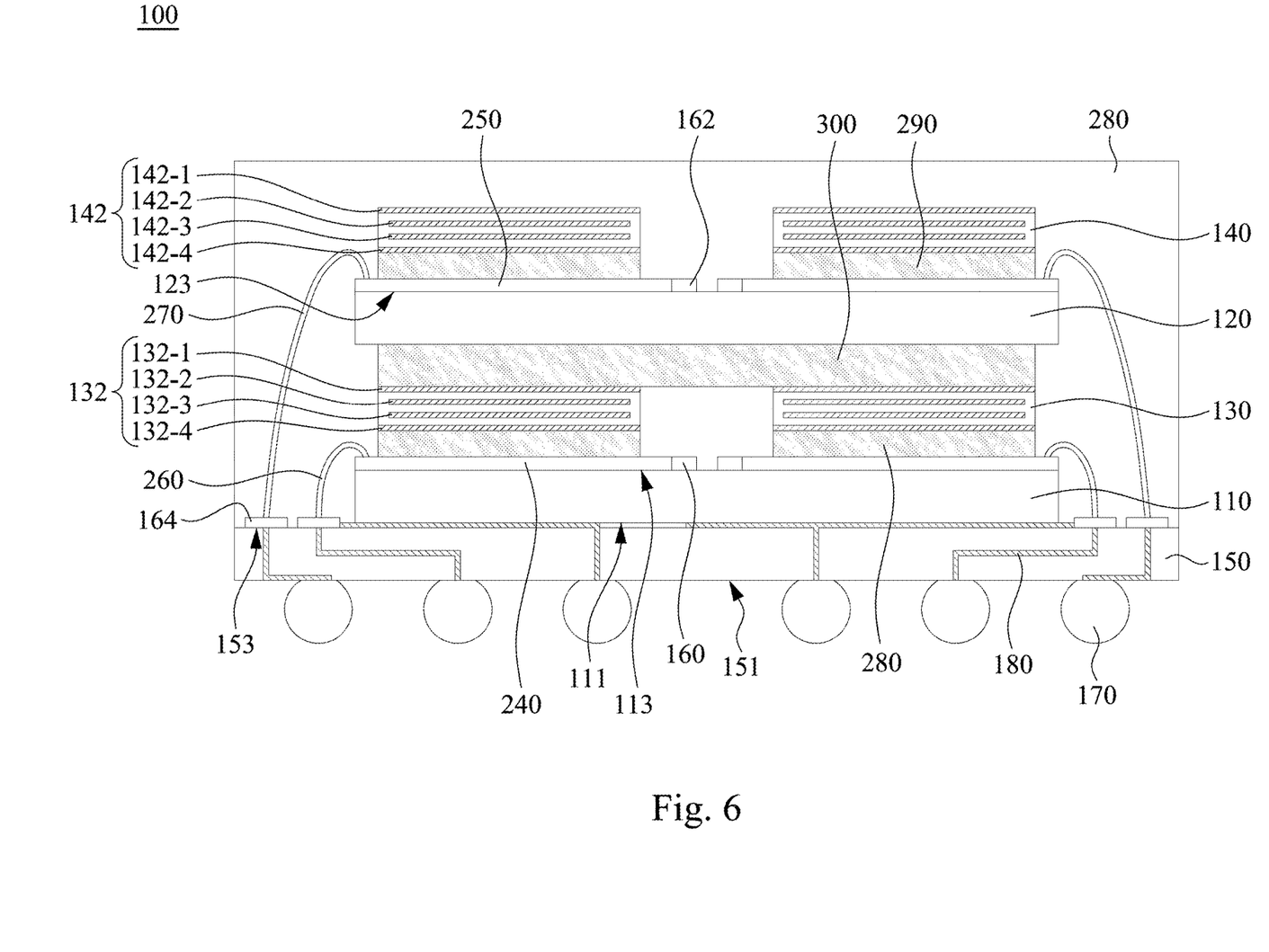
FIG. 6 is a schematic cross-sectional view of the semiconductor package illustrated in FIG. 1 along line 6-6'.

FIG. 6 is a schematic cross-sectional view of the semiconductor package 100 illustrated in FIG. 1 along line 6-6'. As shown in FIG. 1 and FIG. 6, the semiconductor package 100 further includes a plurality of first redistribution layers 240 and a plurality of second redistribution layers 250. The first redistribution layers 240 are on the surface 113 of the first semiconductor die 110 and vertically between the first semiconductor die 110 and the first substrate 130. The second redistribution layers 250 are on the surface 123 of the second semiconductor die 120 and vertically between the second semiconductor die 120 and the second substrate 140. In some embodiments, portions of the first redistribution layers 240 and portions of the second redistribution layers 250 are respectively exposed by the first substrate 130 and the second substrate 140.

In some embodiments, the semiconductor package 100 further includes at least one fifth conductive wire 260 and at least one sixth conductive wire 270. The fifth conductive wire 260 connects at least one of the first redistribution layers 240 to the third substrate 150, such that the first semiconductor die 110 can be electrically connected to an external signal source. The sixth conductive wire 270 connects at least one of the second redistribution layers 250 to the third substrate 150, such that the second semiconductor die 120 can be electrically connected to the signal source. Accordingly, through the configuration of the first redistribution layers 240, the second redistribution layers 250, the fifth conductive wire 260, and the sixth conductive wires 270, the first semiconductor die 110 and the second semiconductor die 120 can be electrically connected to the signal source.

As shown in FIG. 1 to FIG. 6, as mentioned above, the semiconductor package 100 includes the first conductive pads 160, the second conductive pads 162, the first redistribution layers 240, and the second redistribution layers 250. In some embodiments, the first conductive pads 160 are horizontally adjacent the first redistribution layers 240, and the second conductive pads 162 are horizontally adjacent the second redistribution layers 250. As shown in FIG. 1 to FIG. 5, the first conductive pads 160 and the second conductive pads 162 connected to the first substrate 130 and the second substrate 140 are respectively spaced apart from the first redistribution layers 240 and the second redistribution layers 250. As shown in FIG. 6, the first conductive pads 160 and the second conductive pads 162 not being connected to the first substrate 130 and the second substrate 140 are respectively in contact with the first redistribution layers 240 and the second redistribution layers 250.

In some embodiments, the semiconductor package 100 further includes a molding compound 280 encapsulating the first semiconductor die 110, the first substrate 130, the second semiconductor die 120, and the second substrate 140. The molding compound 280 is configured to protect the components of the semiconductor package 100 from being over exposed. In some embodiments, the molding compound 280 further penetrates through the first substrate 130 and the second substrate 140.

According to the aforementioned embodiments of the present disclosure, the semiconductor package is connected to the ground source and the power sources through the first and second substrates, and is connected to the signal source through the first and second redistribution layers. As such, the large resistance which causes the transient voltage drop in the semiconductor package can be prevented, and thus the power supply from external electronic devices can be stably provided to the semiconductor package even when a large transient current is needed. Accordingly, the semiconductor package can still perform well even when there is a demand for large transient current.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A semiconductor package, comprising:
   a first semiconductor die;
   a first substrate disposed on the first semiconductor die, wherein the first substrate comprises a plurality of first metal line layers vertically spaced apart from each other, and each of the first metal line layers is electrically connected to one of the followings: a ground source and a plurality of power sources of different types;
   a plurality of first redistribution layers vertically between the first semiconductor die and the first substrate;

a plurality of conductive pads horizontally adjacent the first redistribution layers, wherein at least one of the conductive pads is in contact with at least one of the first redistribution layers;

a second semiconductor die disposed on the first substrate; and a second substrate disposed on the second semiconductor die, wherein the second substrate comprises a plurality of second metal line layers vertically spaced apart from each other, and each of the second metal line layers is electrically connected to one of the followings: the ground source and the power sources of different types.

2. The semiconductor package of claim 1, further comprising a plurality of conductive wires connecting the first semiconductor die to the first metal line layers.

3. The semiconductor package of claim 1, further comprising a plurality of conductive wires connecting the second semiconductor die to the second metal line layers.

4. The semiconductor package of claim 1, further comprising a plurality of conductive wires each connecting the first metal line layers to one of the followings: the ground source and the power sources of different types.

5. The semiconductor package of claim 1, further comprising a plurality of conductive wires each connecting the second metal line layers to one of the followings: the ground source and the power sources of different types.

6. The semiconductor package of claim 1, further comprising at least one conductive wire connecting at least one of the first redistribution layers to a signal source.

7. The semiconductor package of claim 1, further comprising a plurality of second redistribution layers vertically between the second semiconductor die and the second substrate.

8. The semiconductor package of claim 7, further comprising at least one conductive wire connecting at least one of the second redistribution layers to a signal source.

9. The semiconductor package of claim 7, further comprising a plurality of conductive pads horizontally adjacent the second redistribution layers, wherein at least one of the conductive pads is in contact with at least one of the second redistribution layers.

10. The semiconductor package of claim 1, further comprising a plurality of vias embedded in the first substrate and vertically connecting two of the first metal line layers.

11. The semiconductor package of claim 1, further comprising a plurality of vias embedded in the second substrate and vertically connecting two of the second metal line layers.

12. The semiconductor package of claim 1, further comprising a first adhesive layer vertically between the first semiconductor die and the first substrate.

13. The semiconductor package of claim 1, further comprising a second adhesive layer vertically between the second semiconductor die and the second substrate.

14. The semiconductor package of claim 1, further comprising a third adhesive layer vertically between the second semiconductor die and the first substrate.

15. The semiconductor package of claim 1, further comprising a third substrate on a surface of the first semiconductor die facing away from the first substrate.

16. The semiconductor package of claim 15, further comprising a plurality of solder balls mounted on a surface of the third substrate facing away from first semiconductor die.

17. The semiconductor package of claim 1, further comprising a molding compound encapsulating the first semiconductor die, the first substrate, the second semiconductor die, and the second substrate.

18. The semiconductor package of claim 17, wherein the molding compound penetrates through the first substrate and the second substrate.

* * * * *